United States Patent [19]
Matsubara et al.

[11] Patent Number: 5,561,627
[45] Date of Patent: Oct. 1, 1996

[54] NONVOLATILE SEMICONDUCTOR MEMORY DEVICE AND DATA PROCESSOR

[75] Inventors: Kiyoshi Matsubara, Higashimurayama; Masanao Sato, Tokyo; Eiichi Ishikawa, Kodaira, all of Japan

[73] Assignee: Hitachi, Ltd., Tokyo, Japan

[21] Appl. No.: 458,111

[22] Filed: Jun. 2, 1995

[51] Int. Cl.$^6$ .................................................. G11C 7/00
[52] U.S. Cl. .................. 365/185.04; 365/185.09; 365/185.17; 365/185.23; 365/185.24; 365/185.26; 365/185.33
[58] Field of Search ............... 365/185.04, 185.09, 365/185.17, 185.23, 185.24, 185.26, 185.33

[56] References Cited

U.S. PATENT DOCUMENTS

| | | | |
|---|---|---|---|
| 5,175,840 | 12/1992 | Sawase et al. | 365/185.04 |
| 5,353,256 | 10/1994 | Fandrich et al. | 365/185.33 |
| 5,396,499 | 3/1995 | Urai | 371/21.1 |
| 5,418,752 | 5/1995 | Harari et al. | 365/185.29 |
| 5,444,664 | 8/1995 | Kuroda et al. | 365/226 |
| 5,450,354 | 9/1995 | Sawada et al. | 365/185.24 |

FOREIGN PATENT DOCUMENTS

| | | |
|---|---|---|
| 62-107500 | 5/1987 | Japan . |
| 2-118999 | 5/1990 | Japan . |
| 3-1398 | 1/1991 | Japan . |
| 3-162798 | 7/1991 | Japan . |

*Primary Examiner*—David C. Nelms
*Assistant Examiner*—Trong Phan
*Attorney, Agent, or Firm*—Antonelli, Terry, Stout & Kraus

[57] ABSTRACT

A nonvolatile semiconductor memory device having a redundancy memory cell MC-R and a memory cell MC-C$_0$ for storing relief data for designating a memory cells MC for which the memory cell MC-R is substituted. In writing the relief data, the memory cell MC-C$_0$ is selected by a relief bit selection circuit RSEL. The relief data that is written is initially loaded in relief data latch CLAT by the instruction of a reset signal MD2. In normal writing and reading operations, the address comparator circuit ACMP compares the relief data with the address data fed from an external unit. When they are in agreement, the redundancy memory cell MC-R is selected.

33 Claims, 12 Drawing Sheets

FIG. 2

PROGRAM/ERASE CONTROL REGISTER — WEREG

| Vpp | | | | | PV | E | P |
|---|---|---|---|---|---|---|---|

Vpp BIT: THIS BIT INDICATES WHETHER OR NOT Vpp IS APPLIED

E BIT: IF THIS BIT IS SET, AN ERASE OPERATION IS PERFORMED

P BIT: IF THIS BIT IS SET, A PROGRAM OPERATION IS PERFORMED

Vpp/Vcc/Vss SELECT CIRCUIT

| OPERATION MODE | OUTPUT VOLTAGE SELECTED WORD LINE / NON-SELECTED WORD LINE |
|---|---|
| PROGRAM | Vpp/Vss |
| ERASE | Vss/— |
| READ | Vcc/Vss |

PRINCIPLE OF FLASH MEMORY

FIG. 12

PROGRAM

| MEMORY ELEMENT | SELECT/NON-SELECT | SOURCE | DRAIN | GATE |
|---|---|---|---|---|
| Q1 | SELECT | 0V | 6V | 12V |
| Q2 | NON-SELECT | 0V | 0V | 12V |
| Q3 | NON-SELECT | 0V | 6V | 0V |
| Q4 | NON-SELECT | 0V | 0V | 0V |

ERASE (POSITIVE VOLTAGE SYSTEM)

| MEMORY ELEMENT | SELECT/NON-SELECT | SOURCE | DRAIN | GATE |
|---|---|---|---|---|
| Q1, Q3 | SELECT | 12V | 0V | 0V |
| Q2, Q4 | NON-SELECT | 0V | 0V | 0V |

ERASE (NEGATIVE VOLTAGE SYSTEM)

| MEMORY ELEMENT | SELECT/NON-SELECT | SOURCE | DRAIN | GATE |
|---|---|---|---|---|
| Q1, Q2 | SELECT | 5V | 0V | -10V |
| Q3, Q4 | NON-SELECT | 5V | 0V | 0V |

NONVOLATILE SEMICONDUCTOR MEMORY DEVICE AND DATA PROCESSOR

BACKGROUND OF THE INVENTION

The present invention relates to a technology for relieving defects in a memory cell array in an electrically programmable nonvolatile semiconductor memory device, to a technology for relieving defects that are produced after the memory device is mounted on a board by using a redundancy memory element, and to a data processor capable of repairing defects in a memory cell array that are produced after the memory device is mounted on a board such as a technology that can be effectively adapted to a single-chip microcomputer that contains an electrically rewritable flash memory.

The present inventors have studied about relieving defects in the memory cell array of a nonvolatile semiconductor memory device such as an EEPROM and flash memory. In a conventional technology for relieving defects in a memory cell array using a redundancy memory element, the address of the memory element that is to be relieved is made programmable by, for example, selectively melt-cutting fuses. This technology can, be adapted to initial defects that can be detected in the production but cannot be adapted to relieving defects after mounted on a circuit board as a finished product. The present inventors have discovered the necessity of relieving defects that are produced with the passage of time after mounted since the characteristics of the memory elements in the electrically rewritable nonvolatile memory device deteriorate with an increase in the number of times of rewriting. There has been proposed a semiconductor memory device equipped with a function of detecting, and correcting errors, such as ECC (Error Checking and Correcting circuit) from the standpoint of improving reliability. For this purpose, however, a memory capacity larger than an ordinary capacity is necessary for the error check bit, limiting even events that can be relieved. Therefore, the function fails to serve as means for effectively relieving defects that are produced while the device is being practically used.

Japanese Patent Laid-Open No. 1398/1991 discloses a technology which is related to a one-chip microcomputer containing an EPROM and further containing a circuit which changes the EPROM that happens to become defective to an auxiliary EPROM. Japanese Patent Laid-Open No. 107500/1987 discloses a technology which transfers defective address data stored in a nonvolatile memory element to the latch in a decoder when the power is on and changes the decoder when a defective address is selected. According to Japanese Patent Laid-Open No. 118999/1990 which is concerned with an EEPROM-containing microcomputer, the defective address of the EEPROM is stored in a particular area, the CPU checks the defective address when an access is made to the EEPROM, and a substitute area is used when the check reveals the agreement. Japanese Patent Laid-Open No. 162798/1991 discloses a technology by which defective address data to be relieved are stored in a particular memory element of the memory cell array, and access is changed to a redundancy memory element according to data read out from the above memory element in response to an address that is read out.

SUMMARY OF THE INVENTION

In the technologies disclosed in the above-mentioned Japanese Patent Laid-Open Nos. 1398/1991 and 107500/1987, however, relief data such as address to be relieved are stored in a nonvolatile memory element arranged at a place separate from the memory cell array. Accordingly, a peripheral circuit for rewriting must be exclusively provided.

In the technology disclosed in Japanese Patent Laid-Open No. 162798/1991, relief data are stored in a nonvolatile memory element included in the memory cell array, but the relief data are read out for every access according to the access address. It is therefore considered that the operation for reading the data becomes relatively slow. Even in the technology disclosed in Japanese Patent Laid-Open No. 118999/1990, the relief data such as the address of a defective area is held in the nonvolatile memory element and it is considered that the data-reading operation becomes relatively slow for the same reason as described above.

Referring to the technology disclosed in Japanese Patent Laid-Open No. 118999/1990, relief can be accomplished relatively easily when the EEPROM is used as a data area. When it is assumed that the EEPROM is used as a program region, however, use of a defective area must be avoided by using a jump instruction or the like to avoid the defective area. To do this, the procedure must be started again with the compiling (assembling) and linking of the program. It might be therefore difficult to relieve defects of a nonvolatile memory element storing the program in a state that a nonvolatile semiconductor memory device or a data processor containing it on the chip thereof is mounted on the circuit board (in a so-called on-board state).

The object of the present invention is to provide a nonvolatile semiconductor memory device which is capable of carrying out the reading operation at high speeds even after relief is effected and to provide a data processor mounted with the above semiconductor memory device.

Another object of the present invention is to provide a nonvolatile semiconductor memory device capable of relieving defects in a memory cell array in the on-board state whether the information is about a program or data.

A further object of the present invention is to provide a data processor capable of relieving defects in a nonvolatile memory device contained therein in an on-board state whether the information is about a program or data by using a central processing unit contained therein.

A still further object of the present invention is to provide a nonvolatile semiconductor memory device in which the scale of the circuit required for relief is minimum compared with the circuit scale of the fuse type and for which any particular step of production is not required, and to provide a data processor mounted with the above nonvolatile semiconductor memory device.

The above and other objects as well as novel features of the present invention will become obvious from the description of the specification and the accompanying drawings.

Among the inventions disclosed in this application, a representative will now be briefly described.

(1) A nonvolatile semiconductor memory device (FMRY) includes memory cell arrays (ARY0 to ARY7) of which the selection terminals are coupled to word lines, of which the data terminals are coupled to data lines, and in which a plurality of nonvolatile memory elements are arranged in the form of a matrix. The nonvolatile semiconductor memory device is electrically programmable. Each memory cell array includes nonvolatile redundancy memory elements (MC-R) as substitutes for nonvolatile memory elements that are to be relieved, and nonvolatile memory elements (MC-C) for storing relief data which designate nonvolatile memory elements that are to be substituted by redundancy nonvolatile memory elements, and further includes first selection means (XADEC, YADEC) for selecting nonvolatile memory elements from the memory cell array based upon address data fed from an external unit, second selection means (RSEL) which selects nonvolatile memory elements for storing relief data in response to the instruction to write the relief data and selects a nonvolatile memory element for storing relief data in response to an instruction for reading the relief data, latch means (CLAT) for holding relief data read out from the nonvolatile memory elements storing relief data selected by the second selection means, and third selection means (ACMP) for selecting redundancy nonvolatile memory elements instead of selecting nonvolatile memory elements that are to be relieved by detecting an access to a nonvolatile memory element that is to be relieved based upon the output from the latch means and the address data fed from an external unit.

(2) The data terminals of the redundancy nonvolatile memory elements can be coupled to redundant data lines.

(3) The latch means includes a first area for holding address data of a nonvolatile memory element that is to be relieved, and a second area for holding data (RE) that gives the validity of values of the first area to the third selection means, wherein, when the data of the second area are valid, the third selection means enables the redundancy nonvolatile memory element to be selected based upon the values of the first area.

(4) The data processor includes a nonvolatile semiconductor memory device mounted on the same semiconductor substrate, and is provided with a central processing unit that is capable of making access to, and controlling, the nonvolatile semiconductor memory device.

(5) The instruction to read the relief data can be given by use of a reset signal in the data processor. The relief data is read out during the periods other than the period in which the central processing unit makes access to the nonvolatile memory device via the first selection means.

(6) When abnormal program is detected by the verification in the programing operation of the nonvolatile semiconductor memory device, the central processing unit outputs the access address in which abnormal programing has occurred as program data, gives the second selection means an instruction to select a nonvolatile memory element for storing the relief data, enables the second selection means to select a nonvolatile memory element for storing the relief data after the programing operation has been finished, and enables the latch means to read out the relief data from the nonvolatile memory element for storing the relief data.

(7) According to another aspect of a data processor of the present invention, a nonvolatile semiconductor memory device includes a memory cell array of which the selection terminals are coupled to word lines, of which the data terminals are coupled to data lines, and in which a plurality of nonvolatile memory elements are arranged in the form of a matrix. Each memory cell array includes redundancy nonvolatile memory elements as a substitute for nonvolatile memory elements that are to be relieved, nonvolatile memory elements storing relief data which designate nonvolatile memory elements that are to be substituted by redundancy nonvolatile memory elements, and further includes latch means for holding relief data read out from the nonvolatile memory element for storing the relief data, and selection means which selects a redundancy nonvolatile memory element instead of selecting a nonvolatile memory element that is to be relieved for the access to a nonvolatile memory element that is to be relieved based on the output from the latch means and address data fed from an external unit and selects a nonvolatile memory element which needs not be relieved for the access to a nonvolatile memory element that needs not be relieved, so that the nonvolatile memory elements are reprogrammable. The central processing unit is capable of making access to, and controlling, the nonvolatile semiconductor memory device, and has a first control mode for writing relief data into a nonvolatile memory element for storing the relief data and a second control mode for reading relief data from the nonvolatile memory element for storing relief data and feeding the relief data to the latch means during the operation for initializing the interior thereof. The nonvolatile memory device and the central processing unit are formed on a single semiconductor substrate.

By using the above-mentioned means (1) in which nonvolatile memory elements for storing relief data are provided in a memory cell array, a high voltage-generating circuit for writing is used for writing relief data in order to suppress an increase in the physical scale of the circuit. Relief data is given to the third selection means from the latch means. Therefore, no access is needed to read a nonvolatile memory element that stores relief data for every access, and access speed is prevented from decreasing even though relief by redundancy is possible. The third selection means detects access to a nonvolatile memory element that is to be relieved and selects a nonvolatile memory element for redundancy that is substituted at that time, in order to substitute redundancy for the defect without giving burden to the external unit. In other words, defects in the memory cell array are similarly relieved whether the stored information is about data or program.

By using the above-mentioned means (2), when a small number of nonvolatile memory elements with their data terminals being coupled to particular data lines have defects in a normally-on status, the memory elements sharing the data lines are all affected by the defects. A redundant data line makes it possible to relieve defects in such a status. By using a small number of redundant word lines, it is difficult to efficiently relieve defects in such a status.

By using the above-mentioned means (3), the data of the second area for indicating the validity of the values of the first area is used as a relief enable data, and a programing by melt-cutting the fuse is required neither for the address data that is to be relieved nor for the relief enable data.

By using the above-mentioned means (4), the data processor equipped with a central processing unit capable of making access to, and controlling, the nonvolatile semiconductor memory device, makes it possible to relieve defects in the memory cell array in the nonvolatile semiconductor memory device in an on-board state. By using the above-mentioned means (7) from a different point of view, the data processor has a first control mode for writing relief data into a nonvolatile memory element for storing the relief data and a second control mode for reading relief data from the nonvolatile memory element for storing the relief data and writing them in the latch means during the initialization operation, and is further equipped with a central processing unit for making access to, and controlling, the nonvolatile semiconductor memory device. The data processor makes it possible to relieve defects in the memory cell array in the nonvolatile semiconductor memory device in an on-board state.

By using the above-mentioned means (5), instruction to read the relief data is given by use of a reset signal in the data processor, making it possible to simplify the initial load of relief data into the latch means.

By using the above-mentioned means (6), relief data is stored and is initially loaded into the latch means as part of the reprograming operation of the nonvolatile semiconductor memory device by the central processing unit, facilitating the control procedure for relieving the defects.

BRIEF DESCRIPTION OF THE DRAWINGS

FIG. 2 is a diagram explaining a program/erase control register;

FIG. 12 is a diagram illustrating the voltage conditions for erasing and writing data from, and into, a memory cell in the flash memory.

DESCRIPTION OF THE PREFERRED EMBODIMENTS

Embodiments of the present invention will now be described in the order of the following items:

[1] Principle of storing data in a flash memory.

[2] Flash memory having redundant data line.

[3] Flash memory having redundant word line.

[4] Microcomputer.

[5] Procedure for relieving defects in an on-board state.

[1] Principle of storing data in a flash memory.

Figure 10A:
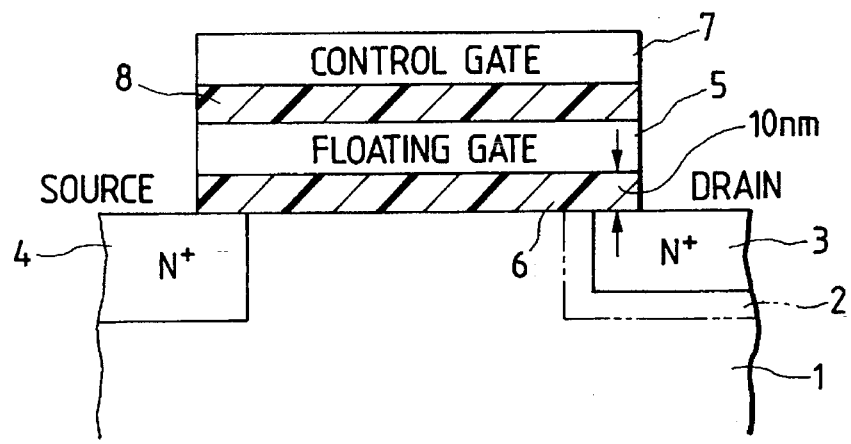
FIGS. 10(A) and 10(B) are diagrams illustrating the principle of a flash memory.

FIG. 10 illustrates the principle of a flash memory. A memory cell representatively shown in FIG. 10(A) is constituted by an insulated-gate type field-effect transistor of a two-layer gate structure. In FIG. 10(A), reference numeral 1 denotes a p-type silicon substrate (semiconductor substrate), 2 denotes a p-type semiconductor region formed on the main surface of the silicon substrate 1, and reference numerals 3 and 4 denote n-type semiconductor regions formed on the main surface of the silicon substrate 1. A channel-forming region is formed between the p-type semiconductor region 2 and the n-type semiconductor region 4 of the silicon substrate 1. Reference numeral 5 denotes a floating gate formed on the p-type silicon substrate 1 via a thin oxide film 6 (having a thickness of, for example, 10 nm) that serves as a tunnel-insulating film, and 7 denotes a control gate formed on the floating gate 5 via an oxide film 8. A source is constituted by the region 4 and a drain is constituted by regions 3 and 2. Data to be stored in this memory cell is held by a transistor substantially as change in threshold voltage. Hereinafter, the transistors for storing the data (often referred to as memory cell transistors) are of n-channel type in the memory cells unless otherwisely described.

Figure 10B:
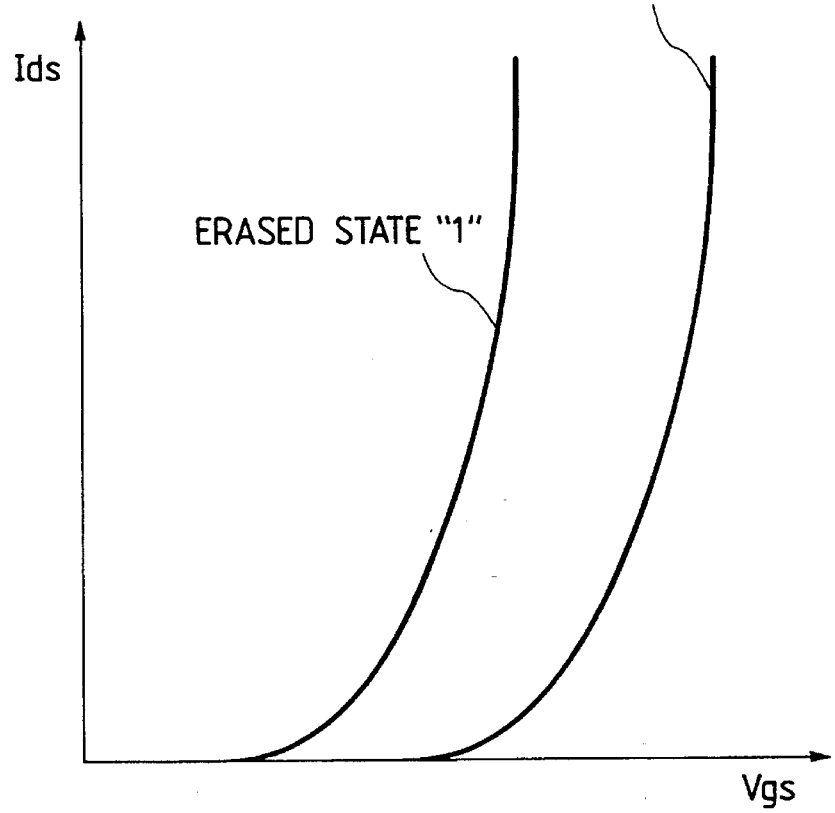

The operation for writing data into the memory cell is realized by applying a high voltage to, for example, a control gate 7 and to a drain, to inject electrons into the floating gate 5 from the drain side by avalanche injection. Due to this programing operation as shown in FIG. 10(B), the threshold voltage of the memory transistor which is higher when viewed from the control gate 7 than that of the memory transistor in an erased state of which the writing operation is not effected.

The erasing operation, on the other hand, is realized by applying a high voltage to, for example, the source to extract electrons from the floating gate 5 into the source side by use of the tunnel phenomenon. Due to the erasing operation as shown in FIG. 10(B), the threshold voltage of the memory transistor is lowered when viewed from the control gate 7. In FIG. 10(B), the memory cell transistor has a threshold value of a positive level in both the programed state and the erased state. That is, the programed state has a high threshold voltage and the erased state has a low threshold voltage with respect to the word line selection level that is given from the word line to the control gate 7. By establishing the above-mentioned relationship among the two threshold voltages and the word line selection level, it is possible to constitute a memory cell using one transistor without employing a selection transistor. To electrically erase the stored data, the electrons accumulated in the floating gate 5 are extracted by the source electrode. When the erasing operation is continued for a relatively long period of time, therefore, a larger amount of electrons than the amount of electrons injected into the floating gate 5 are extracted during the writing operation. When over-erasing is effected in which the electric erasing is continued for a relatively long period of time, therefore, the threshold voltage of the memory cell changes to a negative level, bringing about such an inconvenience that the memory cell is selected even though the word line is at a non-selection level. Like the erasing, the writing can also be effected by utilizing a tunnel current.

In the reading operation, the voltages applied to the drain and to the control gate 7 are limited to relatively low values so that a weak writing of the memory cell, i.e., injection of undesired carriers into the floating gate 5 is not caused. For instance, a voltage as low as about 1 V is applied to the drain and a voltage as low as about 5 V is applied to the control gate 7. The magnitude of the channel current flowing through the memory cell transistor is measured using these applied voltages to determine logical values "0", "1" of data stored in the memory cell.

Figure 11:
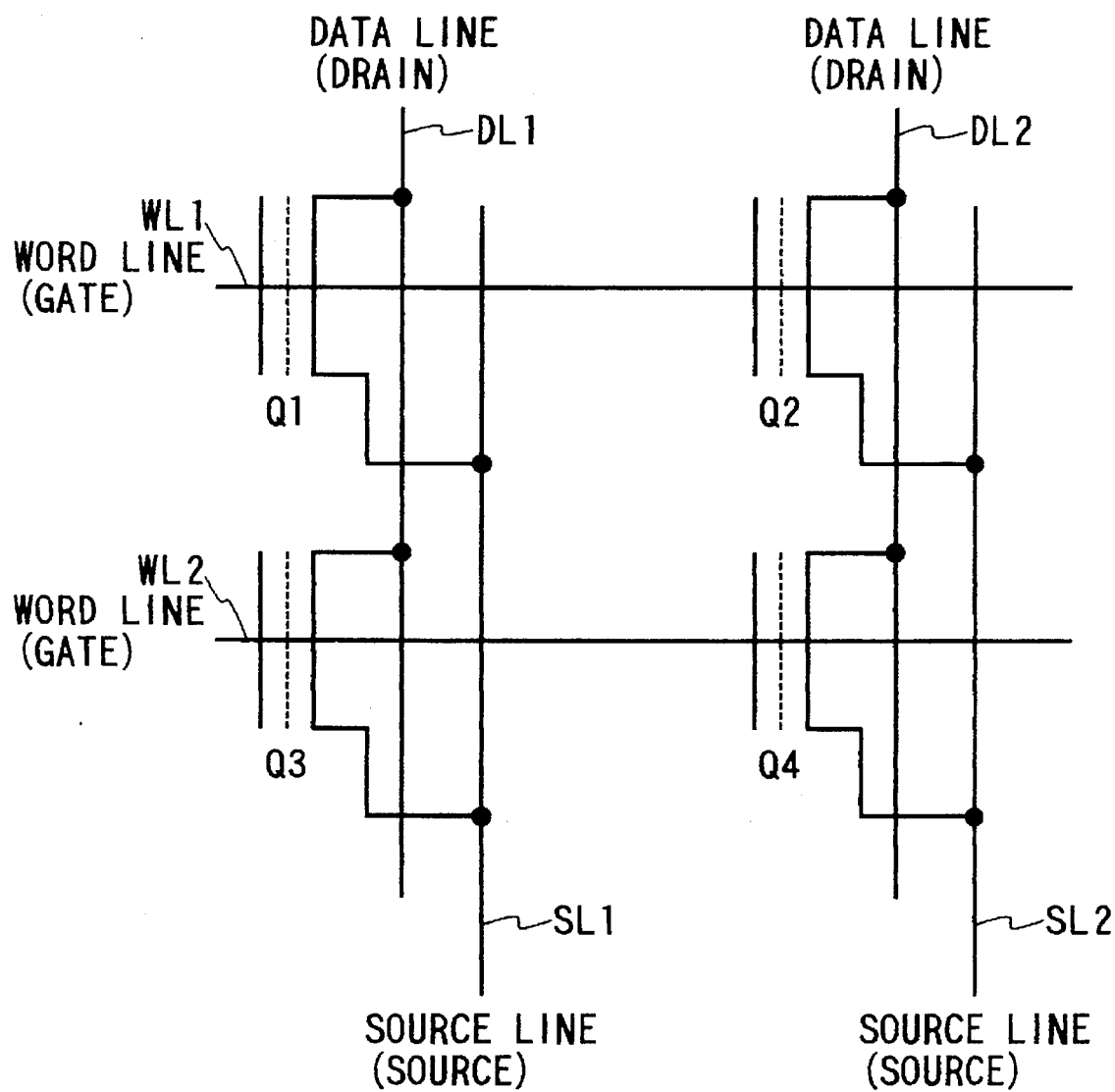
FIG. 11 is a circuit diagram illustrating the principle of a memory cell array in the flash memory.

FIG. 11 is a diagram illustrating the constitution and principle of a memory cell array employing the above-mentioned memory cell transistors, wherein four memory cell transistors Q1 to Q4 are representatively shown. In the memory cells arranged in the form of a matrix in the X- and Y-directions, control gates (memory cell selection gates) of memory cell transistors Q1, Q2 (Q3, Q4) arranged in the same row are connected to a corresponding word line WL1 (WL2), and drain regions (input/output nodes of memory cells) of memory transistors Q1, Q3 (Q2, Q4) arranged in the same column are connected to a corresponding data line DL1 (DL2). Source regions of the memory transistors Q1, Q3 (Q2, Q4) are coupled to a source line SL1 (SL2).

FIG. 12 illustrates a voltage condition for effecting the erasing operation and the writing operation for the memory cell, wherein a memory element is a memory cell transistor and a gate is a control gate that works as a selection gate of the memory cell transistor. In FIG. 12, the erasing of the negative voltage system forms a high electric field that is needed for the erasing by applying a negative voltage of, for example, $-10$ V to the control gate. In the erasing of the positive voltage system as will be obvious from the voltage condition shown in FIG. 12, it is possible to effect batched-erasing of at least those memory cells of which the sources are connected in common. In the constitution of FIG. 11, therefore, the four memory cells Q1 to Q4 can be simultaneously erased when the source lines SL1 and SL2 are connected together. Source line dividing systems include a system where a data line is used as a unit (common source line extends in the direction of data line) as representatively shown in FIG. 11 and a system where a word line is used as a unit (common source line extends in the direction of word line). In erasing a negative voltage system, on the other hand, the batched-erasing can be effected for those memory cells of which the control gates are connected in common.

[2] Flash memory having spare data line.

Figure 1:
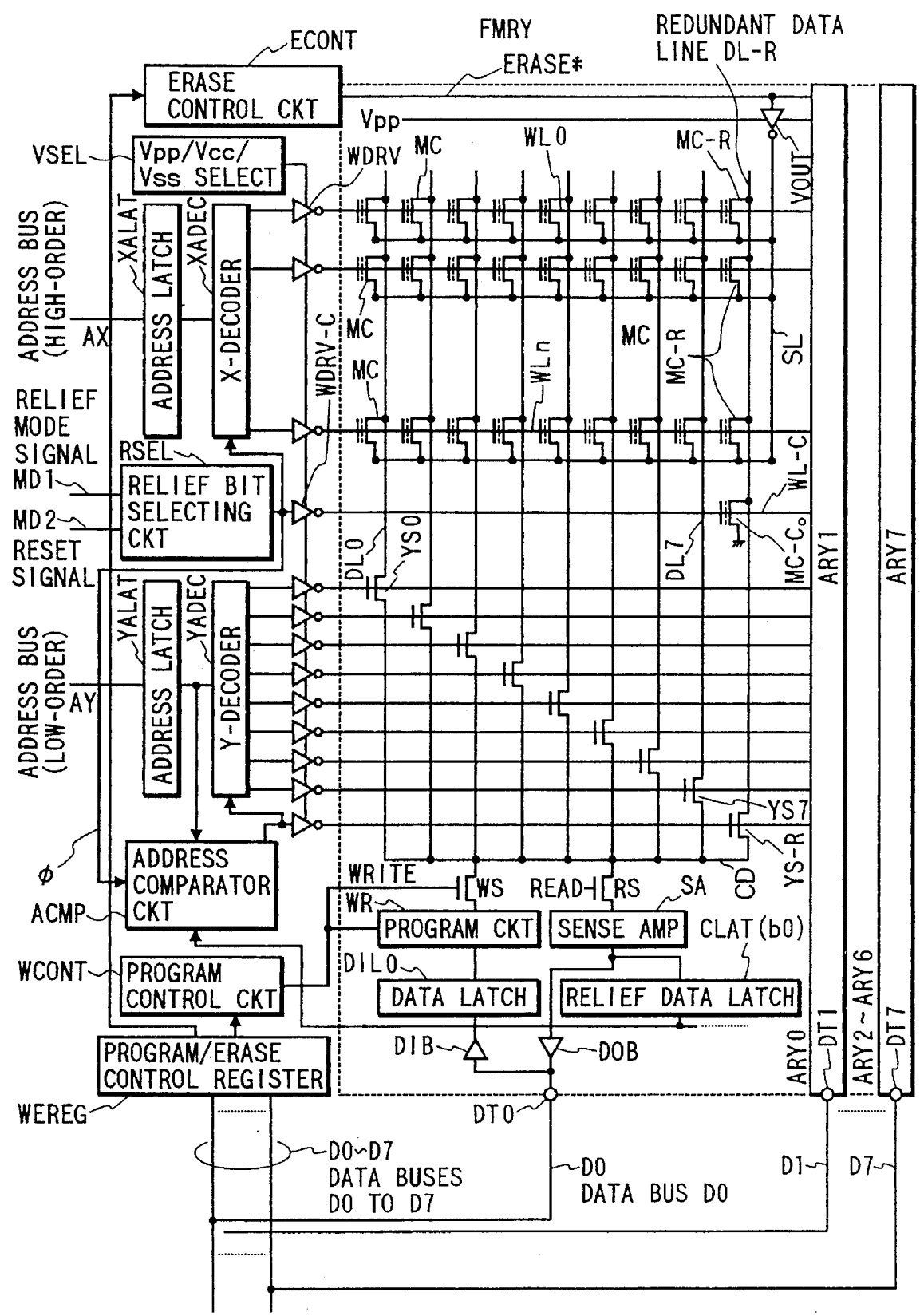
FIG. 1 is a circuit diagram of a flash memory having a redundant data line of an embodiment according to the present invention.

FIG. 1 is a circuit diagram of a flash memory FMRT of an embodiment according to the present invention. The flash memory FMRY shown in FIG. 1 has data input/output terminals DT0 to DT7 of eight bits, and is provided with memory arrays ARY0 to ARY7 for each of the data input/output terminals. The memory arrays ARY0 to ARY7 have the same structure and constitute a memory cell array.

Each of the memory arrays ARY0 to ARY7 includes memory cells MC constituted by insulated-gate type field-effect transistors of the two-layer gate structure explained with reference to FIG. 10, redundancy memory cells MC-R and memory cells MC-$C_0$ for storing relief data, which are arranged in a matrix. The memory cells MC are the ones that can be relieved even when they are defective. The memory cells MC-R are the ones for redundancy to be substituted for the memory cells MC that are to be relieved, and the memory cells MC-$C_0$ are the one for storing relief data designating a memory cell MC that is to be replaced by the memory cell MC-R. The memory cells MC, MC-R and MC-$C_0$ are arranged in the same way in all of the memory arrays ARY0 to ARY7. Therefore, the memory cells MC-R are arranged in a column in each memory array, and eight memory cells MC-$C_0$ (for eight bits) are provided in total in all of the memory arrays.

In FIG. 1, WL0 to WLn and WL-C are word lines which are common in all of the memory arrays ARY0 to ARY7. The control gates of memory cells arranged in the same row are connected to a corresponding word line. The word line WL-C is provided exclusively for the memory cell MC-$C_0$ for selecting a memory cell that is to be relieved. In the memory arrays ARY0 to ARY7, the drain regions of memory cells MC, MC-R and MC-$C_0$ arranged in the same column are connected to the corresponding data lines DL0 to DL7 and DL-R. The data line DL-R is a redundant data line provided exclusively for the memory cells MC-R and MC-$C_0$. The source regions of memory cells MC and MC-R are connected to the source line SL in common. The source region of the memory cell MC-$C_0$ is grounded (0 V in this embodiment).

The source line SL is fed with a high voltage Vpp used for the erasing from a voltage output circuit VOUT such as an inverter circuit. The output operation of the output voltage circuit VOUT is controlled by an erase signal ERASE* (a signal marked with * is a low enable signal) output from an erase control circuit ECONT. That is, during a low-level period of the erase signal ERASE*, the voltage output circuit VOUT supplies a high voltage Vpp to the source line SL, so that a high voltage necessary for the erasing is fed to the source regions of all memory cells MC and MC-R. Therefore, the flash memory FMRY can be erased at a time. The memory cells MC-$C_0$ are excluded from the objects to be erased.

The word lines WL0 to WLn are selected by an X-address signal AX received through an X-address latch XALAT which is decoded by an X-address decoder XADEC. The word driver WDRV drives the word line based upon a selection signal output from the X-address decoder XADEC. In the operation of reading data, the word driver WDRV is operated by a power source of a voltage Vcc such as 5 V, fed from a voltage selection circuit VSEL and ground potential Vss, such as 0 V. A word line to be selected is driven to a selection level by the voltage Vcc and a word line which is not to be selected is maintained at a non-selection level such as the ground potential Vss. In the operation of writing data, the word driver WDRV is operated by a voltage Vpp such as 12 V fed from the voltage selection circuit VSEL and ground voltage Vss such as 0 V, and drives a word line to be raised to a high-voltage level for writing such as 12 V. In the operation of erasing data, the output of the word driver WDRV is at a low voltage level such as 0 V.

The word line WL-C is driven by the word driver WDRV which receives the output from a relief bit selection circuit RSEL. The driving voltage is given by the voltage selection circuit VSEL like the word driver WDRV.

In the memory arrays ARY0 to ARY7, the data lines DL0 to DL7 and DL-R are connected in common to a common data line CD via Y-selection switches YS0 to YS7 and YS-R. The Y-selection switches YS0 to YS7 are controlled by the Y-address signal received via a Y-address latch YALAT and decoded by a Y-address decoder YADEC. Output selection signals of the Y-address decoder YADEC are fed in common to all of the memory arrays ARY0 to ARY7. Therefore, when any one of the output selection signals of the Y-address decoder YADEC goes to a selection level, a data line is connected to a common data line CD of the memory arrays ARY0 to ARY7. A Y-selection switch YS-R which is provided exclusively for the redundant data line DL-R is selected based upon the output of an address comparator circuit ACMP.

The data read out into the common data line CD from the memory cell MC is given to a sense amplifier SA via a selection switch RS, amplified and output to a data bus via a data output buffer DOB. The selection switch RS is controlled by a read signal READ. CLAT (b0) corresponds to the bit b0 of a relief data latch CLAT that stores relief data read out from the memory cell MC-$C_0$. Relief data stored in the memory cells MC-$C_0$ to MC-$C_7$ of all memory arrays ARY0 to ARY7 are set in bits b0 to b7 of the relief data latch CLAT. Therefore, the data stored in the relief data latch CLAT consists of a total of eight bits.

The write data fed from an external unit is held by a data input latch DIL0 via a data input buffer DIB. When the data held by the data input latch DIL0 is "0", the write circuit WR feeds a high voltage for writing to the common data line CD via the selection switch WS. The high voltage for writing is fed, via a data line selected by Y-selection switches YS0 to YS7 and YS-R, to the drain of a memory cell in which a high voltage is applied to the control gate through the word line, so that data is written into the memory cell. The selection switch WS is controlled by a control signal WRITE. A variety of timings for writing and the procedure of writing operation such as voltage selection control are controlled by a write control circuit WCONT. A program/erase control register WEREG gives a write operation instruction and a write verifying operation for the program control circuit WCONT and gives an erase operation instruction and an erase verifying operation instruction for the erase control circuit ECONT. The control register WEREG is connectable to the data bus, and control data from an external unit (CPU 12 that will be described later) are written into the control register WEREG.

As shown in FIG. 2, the control register WEREG has a bit Vpp, a bit PV, a bit P and a bit E. The bit P is a bit for instructing the writing operation. The bit E is a bit for instructing the erasing operation. By the setting of the bit Vpp and the bit E, the erase control circuit ECONT that makes reference to the bits controls the internal operation for erasing according to a predetermined procedure. By the setting of the bit Vpp and the bit P, furthermore, the program control circuit WCONT that makes reference to the bits controls the internal operation for programming according to a predetermined procedure. The internal operation for erasing and programming is executed by generating a voltage that was described with reference to FIG. 12, and by applying a predetermined voltage to the word lines. The erase verifying operation is an operation of verifying whether or not erasing is completed by performing reading of the memory cell that has been erased, and the program verifying operation is an operation of verifying whether or not programming is completed by reading out program data in the memory cell that has been programed and by comparing the program data which has been read with the program data. These verifying operations are executed when an exter CPU or the data processor starts a read cycle for the flash memory.

Here, the constitution for relieving defects in the flash memory FMRY of FIG. 1 will be described in detail.

Figure 3:
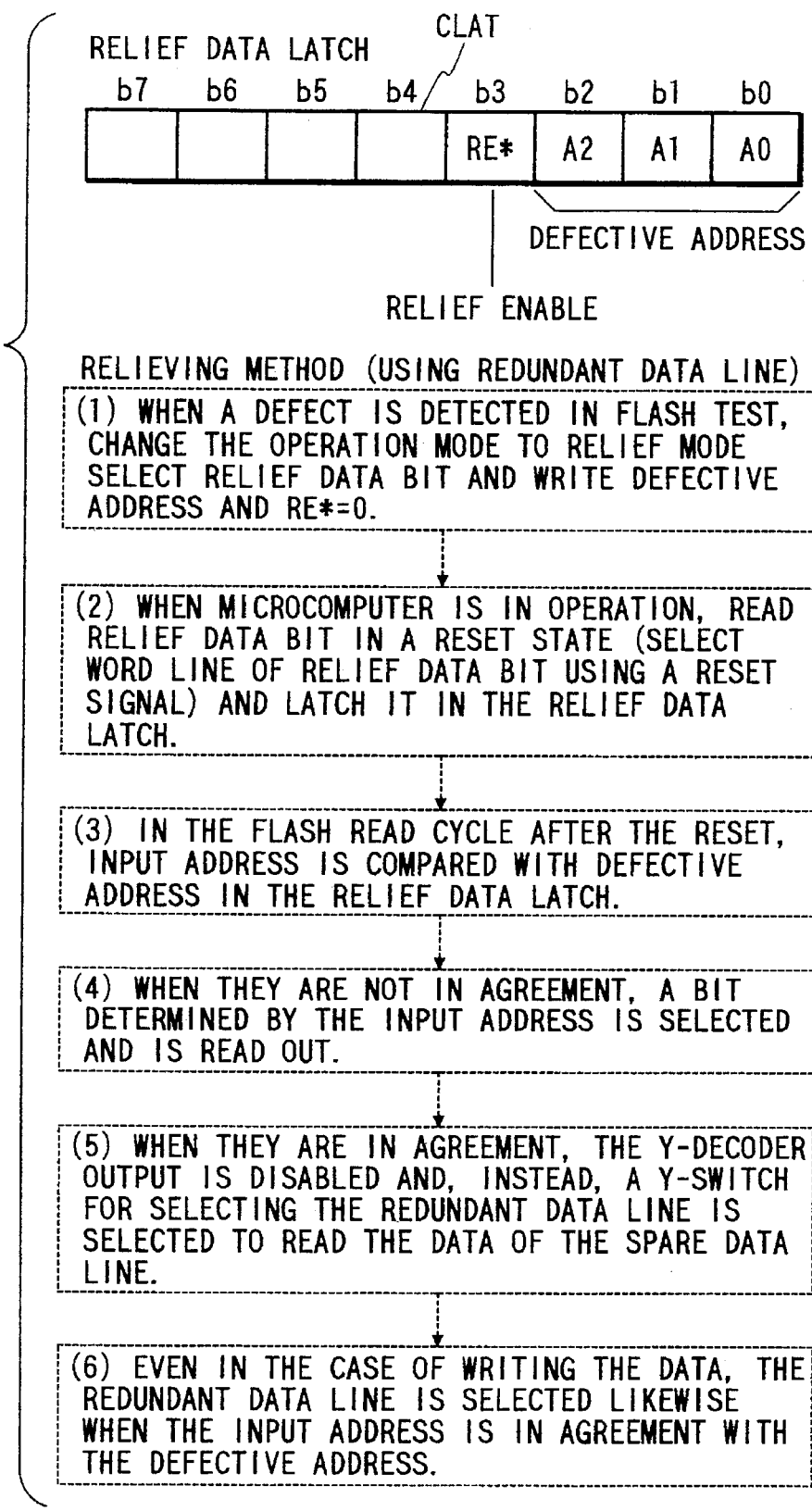
FIG. 3 is a diagram illustrating relief data in the flash memory of FIG. 1 and the relieving procedure using the relief data.

First, the relief data latch CLAT of 8 bits stores defect addresses A2 to A0 in its three least significant bits as shown in FIG. 3, and stores a relief enable bit RE* in the fourth bit. Referring to FIG. 1, each of the memory arrays ARY0 to ARY7 has eight data lines SL0 to DL7 and a redundant data line DL-R. Therefore, a defective address can be specified by the three least significant bits in the address signal. When the relief enable bit RE* is at a low level, this indicates that the values of the least significant three bits of the relief data latch CLAT are effective. That is, the three least significant bits of the relief data latch CLAT are regarded to be a defective address only when the relief enable bit RE* is at the low level.

Roughly speaking, the relief bit selection circuit RSEL controls the selection of the memory cells MC-C$_0$ up to MC-C$_7$ that are not shown and used for storing relief data, and the address comparator circuit ACMP performs a control operation to select the redundant data line DL-R. The relief bit selection circuit RSEL receives a relief mode signal MD1 and a reset signal MD2. The address comparator circuit ACMP receives the output of the relief bit selection circuit RSEL, the output of the Y-address latch YALAT and the output of the relief data latch CLAT. The flash memory FMRY is in a relief program mode when the relief mode signal MD1 is at the active level, is in a relief data latch mode when the reset signal MD2 is at the active level, and is in a normal mode when the relief mode signal MD1 and the reset signal MD2 are at inactive levels. In the relief program mode and the relief data latch mode, the relief bit selection circuit RSEL outputs a control signal φ of the low level.

When the relief mode signal MD1 is at the active level to establish the relief program mode, the relief bit selection circuit RSEL outputs a control signal φ of low level to inhibit the word line selection operation of the X-address decoder XADEC and, instead, selects the word line WL-C which is provided exclusively for the memory cells MC-C$_0$ to MC-C$_7$ for storing the relief data. The relief bit selection circuit RSEL then causes the address comparator circuit ACMP to inhibit the operation of selecting the Y-selection switches YS0 to YS7 by the Y-address decoder YADEC and, instead, causes the address comparator circuit ACMP to select the Y-selection switch YS-R which is provided exclusively for the redundant data line DL-R. In this case, when the program operation is instructed by setting the bit Vpp and the bit P to the program/erase control register WEREG, the relief data fed from an external unit to the data latch DIL0 of the memory array ARY0 is written into the memory cell MC-C$_0$. Though not diagramed for simplicity of illustration, each of the memory arrays ARY1 to ARY7 has a data latch DIL0 possessed by the memory array ARY0, memory cell MC-C$_0$, data latches DIL1 to DIL7 corresponding to the relief data latch b0, memory cells MC-C$_1$ to MC-C$_7$, and relief data latches b1 to b7. Therefore, relief data fed from an external unit to the data latches DIL0 to DIL7 of the memory arrays ARE1 to ARY7 are written into the memory cells MC-C$_1$ to MC-C$_7$. The relief data to be written are shown in FIG. 3, and defective addresses A2 to A0 to be relieved and the relief enable bit RE* of the active level such as the low level are stored in b0 to b3 of the relief data latch CLAT. In this embodiment, the data stored in b7 to b4 do not have any particular meanings.

When the reset signal MD2 is allowed to go to the active level to establish the relief data latch mode, the relief bit selection circuit RSEL outputs a control signal φ of the low level to inhibit the word line selection operation of the X-address decoder XADEC and, instead, selects the word line WL-C which is provided exclusively for the memory cell MC-C for storing relief data. The address comparator circuit ACMP inhibits the selection operation of selecting T-selection switches YS0 to YS7 by the Y-address decoder TADEC and, instead, selects the Y-selection switch YS-R which is provided exclusively for the spare data line DL-R. Furthermore, the relief bit selection circuit RSEL outputs a control signal READ of the selection level, activates the sense amplifier SA, and causes the relief data latch CLAT to perform the latching operation. Then, the relief data stored in the memory cells MC-C$_0$ to MC-C$_7$ are internally transferred to the bits b0 to b7 of the relief data latch CLAT. The relief data internally transferred are output to the address comparator circuit ACMP. The reset signal MD2 serves as a power-on reset signal of the system which employs the flash memory FMRY or as a reset signal for the flash memory FMRY, though not limited to this. When the power source circuit is closed, therefore, the relief data held in a nonvolatile manner in the memory cells MC-C$_0$ to MC-C$_7$ are loaded in the bits b0 to b7 of the relief data latch CLAT. Therefore, the relief data does not need to be read out from the memory cells MC-C$_0$ to MC-C$_7$ in advance for every read access or write access, and the access speed can be increased by the time required to read the relief data. After the relief data is programed in the memory cells MC-C$_0$ to MC-C$_7$, furthermore, the relief data latch mode is set by the reset signal MD2 to initially load the relief data.

In the normal mode, the address comparator circuit ACMP compares the address signal output from the Y-address latch YALAT with the defective address output from the relief data latch CLAT. When they are in agreement as the result of comparison or, in other words, when access is made to the memory cell MC which is defective and is to be relieved, the operation of selecting Y-selection switches YS0 to YS7 by the Y-address decoder YADEC is inhibited and, instead, the Y-selection switch YS-R is selected that is provided exclusively for the spare data line DL-R. Therefore, in the read access or the write access by an address signal including the same least significant addresses as the defective addresses A2 to A0, the spare data line DL-R is selected. The coincidence output is produced by the address comparator circuit ACMP only when the relief enable bit RE* is at the active level such as the low level.

Figure 4:
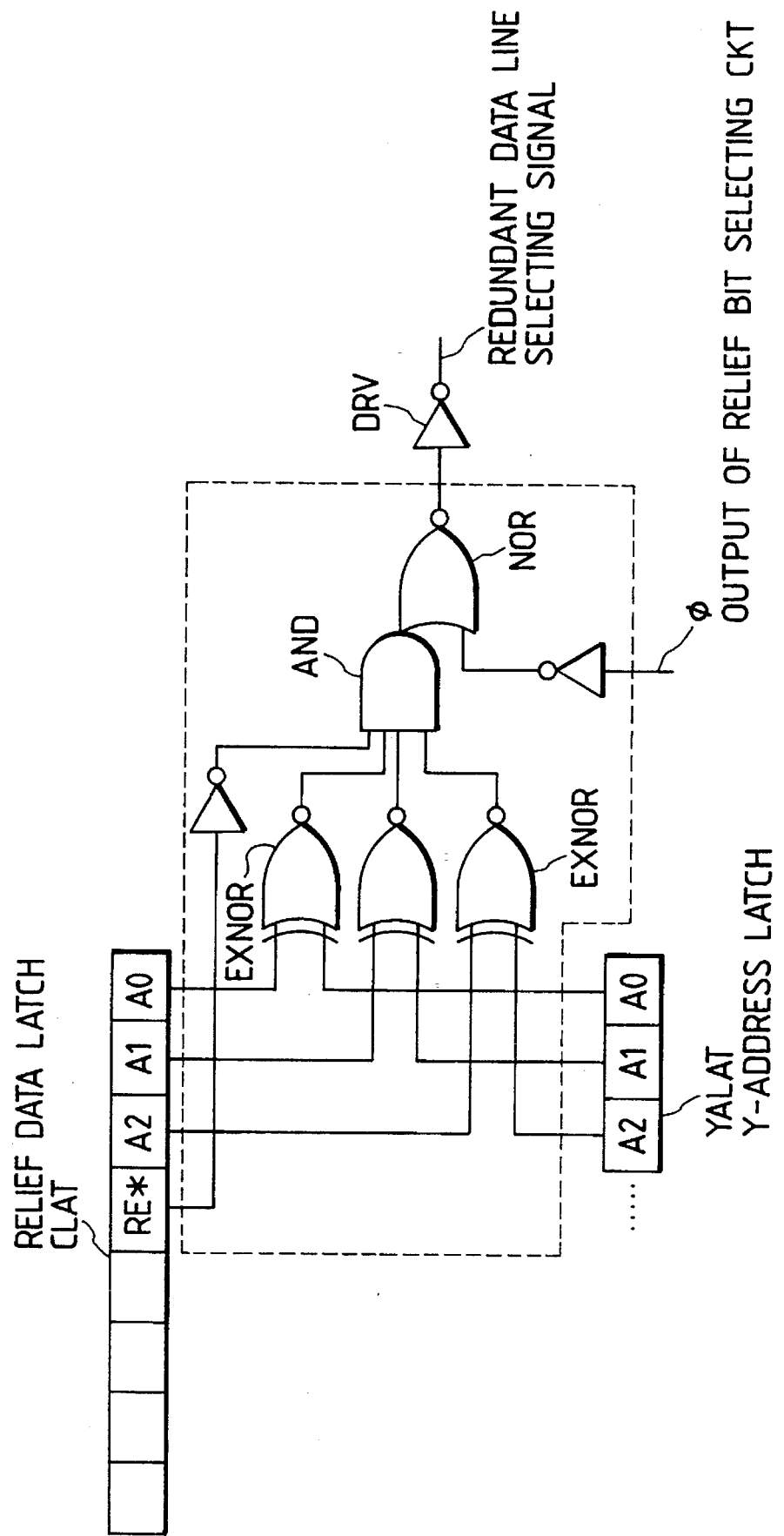
FIG. 4 is a logic circuit diagram showing an address comparator circuit.

FIG. 4 illustrates an address comparator circuit ACMP. That is, the exclusive negative logical sum gate EXNOR detects the coincidence of address bits A0, A1 and A2. Only when the whole bits are in agreement and the relief enable bit RE* is at the low level, the output of a logical product gate AND goes to the high level. The output of the logical product gate AND and the inverted signal of the output signal φ of the relief bit selection circuit RSEL are fed to a negative logical sum gate NOR. A driver circuit DRV that receives the output of the negative logical sum gate NOR outputs a redundant data line selection signal. The signed φ is at the low level in the relief program mode and in the relief data latch mode.

[3] Flash memory having a redundant word line.

Figure 5:
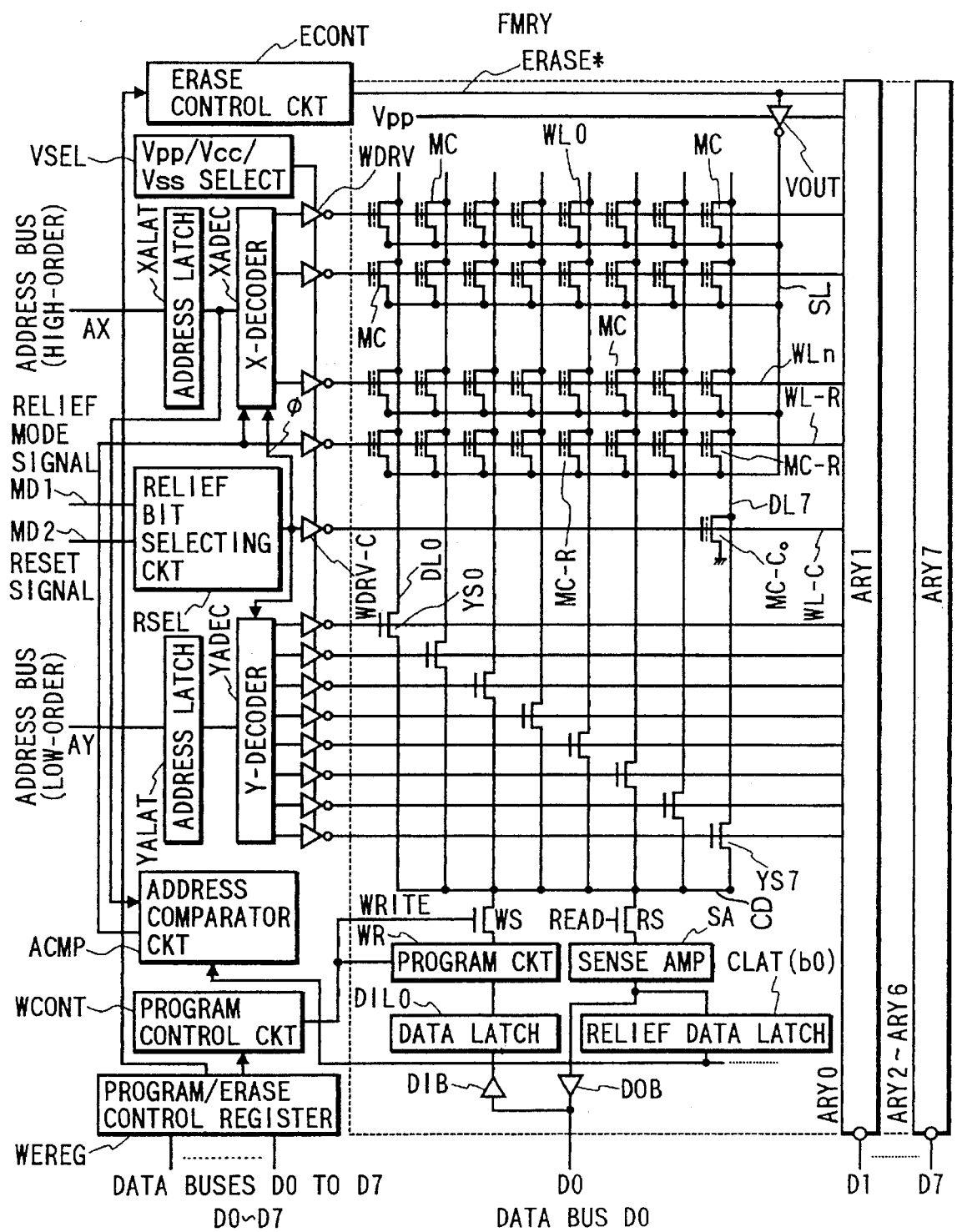
FIG. 5 is a circuit diagram of a flash memory having a redundant word line of another embodiment according to the present invention.

FIG. 5 illustrates a flash memory FMRY having a redundant word line of another embodiment according to the present invention. The difference from FIG. 1 is that a redundant word line WL-R for one row is provided instead of the redundant data line DL-R and, accordingly, the Y-selection switch YS-R is abolished and functions corresponding to these changes are imparted to the relief bit selection circuit RSEL and to the address comparator circuit ACMP. In other respects, the constitution is the game as the one of FIG. 1. The circuit blocks and circuit elements having the same functions as those of FIG. 1 are denoted by the same reference numerals but their description will be not repeated here. The differences from FIG. 1 will be described in detail below.

Figure 6:
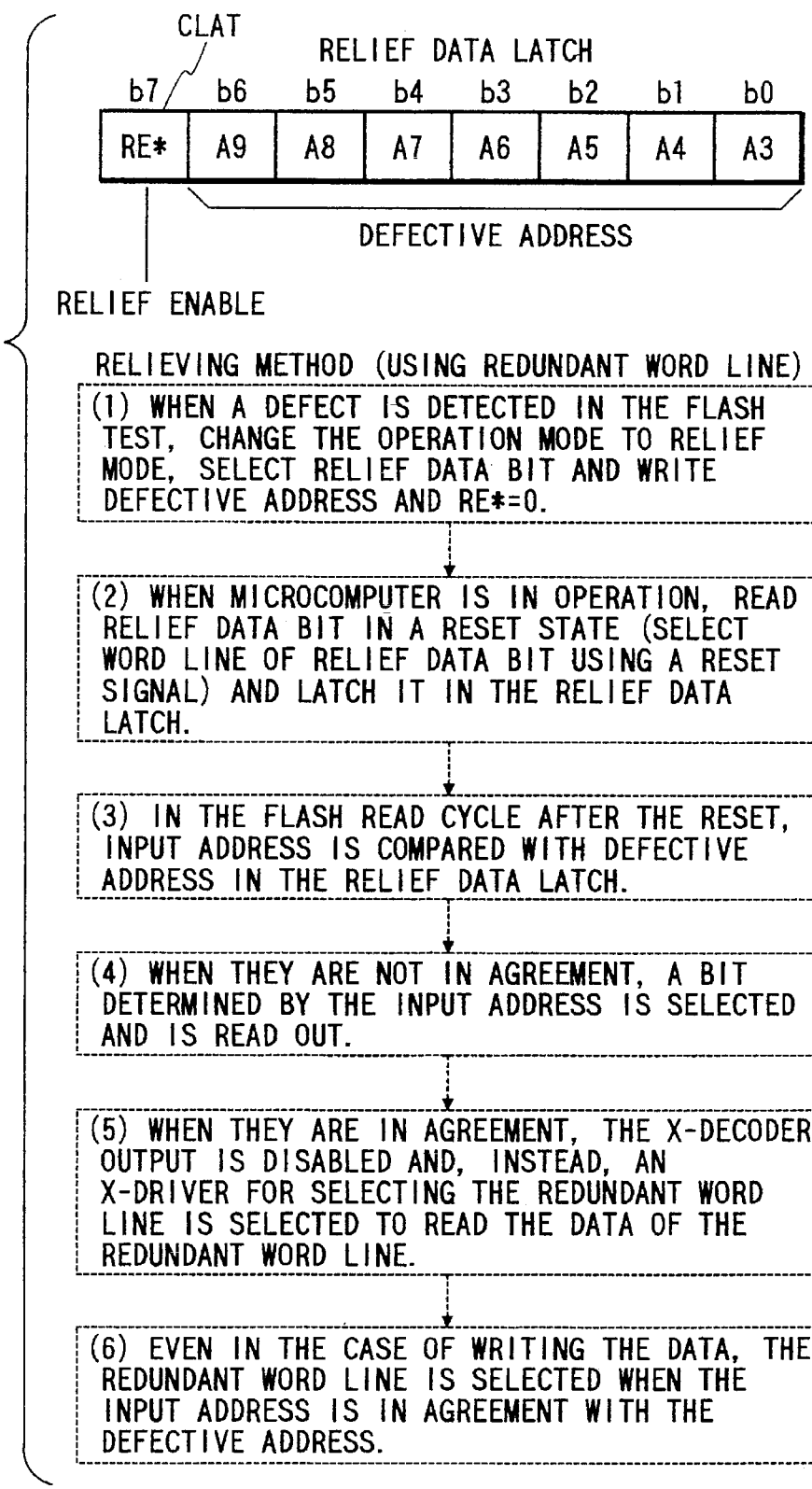
FIG. 6 is a diagram illustrating relief data in the flash memory of FIG. 5 and a relieving procedure using the relief data.

First, the 8-bit relief data latch CLAT stores defect addresses A3 to A9 in its least significant bit b0 through up to a bit b6 as shown in FIG. 6, and stores a relief enable bit RE* in the most significant bit b7. The number of bits of defective address is determined based on the assumption that there are 128 word lines WL0 to WLn in FIG. 5. When the relief enable bit RE* is at the low level, this indicates that the values of the least significant seven bits of the relief data latch CLAT are effective. That is, the least significant seven bits of the relief data latch CIAT are regarded to be a defective address only when the relief enable bit RE* is at the low level.

Roughly speaking, the relief bit selection circuit RSEL controls the selection of the memory cells MC-$C_0$ up to MC-$C_7$ for storing relief data, and the address comparator circuit ACMP performs a control to select the spare data line WL-R. The relief bit selection circuit RSEL receives a relief mode signal MD1 and a reset signal MD2. The address comparator circuit ACMP receives the output of the X-address latch XALAT and relief data output from the relief data latch CLAT of all memory arrays. The flash memory FMRY is in a relief program mode when the relief mode signal MD1 is at the active level, is in a relief data latch mode when the reset signal MD2 is at the active level, and is in a normal mode when the relief mode signal MD1 and the reset signal MD2 are at the inactive levels. In the relief program mode and the relief data latch mode, the relief bit selection circuit RSEL outputs a control signal φ of the low level.

When the relief mode signal MD1 is caused to go to the active level to establish the relief program mode, the relief bit selection circuit RSEL outputs a control signal φ of the low level to inhibit the word line selection operation of the X-address decoder XADEC and, instead, selects the word line WL-C which is provided exclusively for the memory cells MC-$C_0$ to MC-$C_7$ for storing the relief data. The Y-address decoder YADEC is then caused to select the Y-selection switch YS7. At this moment, when the write operation is instructed by setting the bit Vpp and the bit P to the write/erase control register WEREG, the relief data fed from an external unit to the data latch DIL0 of the memory array ARY0 is written into the memory cell MC-$C_0$. As described with reference to FIG. 1, the memory arrays ARY1 to ARY7 have data latches DIL0 to DIL7, memory cells MC-$C_1$ to MC-$C_7$, and relief data latches b1 to b7. Therefore, relief data fed from an external unit to the data latches DIL1 to DIL7 of the memory arrays ARE1 to ARY7 are written into the memory cells MC-$C_1$ to MC-$C_7$. The relief data to be written are shown in FIG. 6, and defective addresses A9 to A3 to be relieved and the relief enable bit RE* of the active level such as the low level are stored in b0 to b7 of the relief data latch CLAT.

When the reset signal MD2 is caused to go to the active level to establish the relief data latch mode, the relief bit selection circuit RSEL outputs a control signal φ of the low level to inhibit the word line selection operation of the X-address decoder XADEC and, instead, selects the word line WL-C which is provided exclusively for the memory cells MC-$C_0$ to MC-$C_7$ for storing relief data. Furthermore, the Y-address decoder TADEC selects the Y-selection switch YS7. The relief bit selection circuit RSEL outputs a control signal READ of the selection level, activates the sense amplifier SA, and causes the relief data latch CLAT to perform the latching operation. Then, the relief data stored in the memory cells MC-$C_0$ to MC-$C_7$ are latched in the bits b0 to b7 of the relief data latch CLAT. The relief data that have been latched are output to the address comparator circuit ACMP.

In the normal mode, the address comparator circuit ACMP compares the address signal output of the X-address latch XALAT with the defective addresses A9 to A3 output from the relief data latch CLAT. When they are in agreement as the result of comparison or, in other words, when access is made to a memory cell MC which is defective and is to be relieved, the operation of selecting word lines WL0 to WLn by the X-address decoder XADEC is inhibited and, instead, the redundant word line WL-R is selected. In the read access or the program access by an address signal including the same most significant addresses as the defective addresses A9 to A3, therefore, the redundant word line WL-R is selected. The coincidence output is produced by the address comparator circuit ACMP only when the relief enable bit RE* is at the active level such as the low level. In this case, the address comparator circuit ACMP can be constituted by a circuit in which the negative logical sum gate NOR of FIG. 4 is replaced with an inverter which outputs a signal which is the inversion of the output of the logical product gate AND.

[4] Microcomputer

Figure 7:
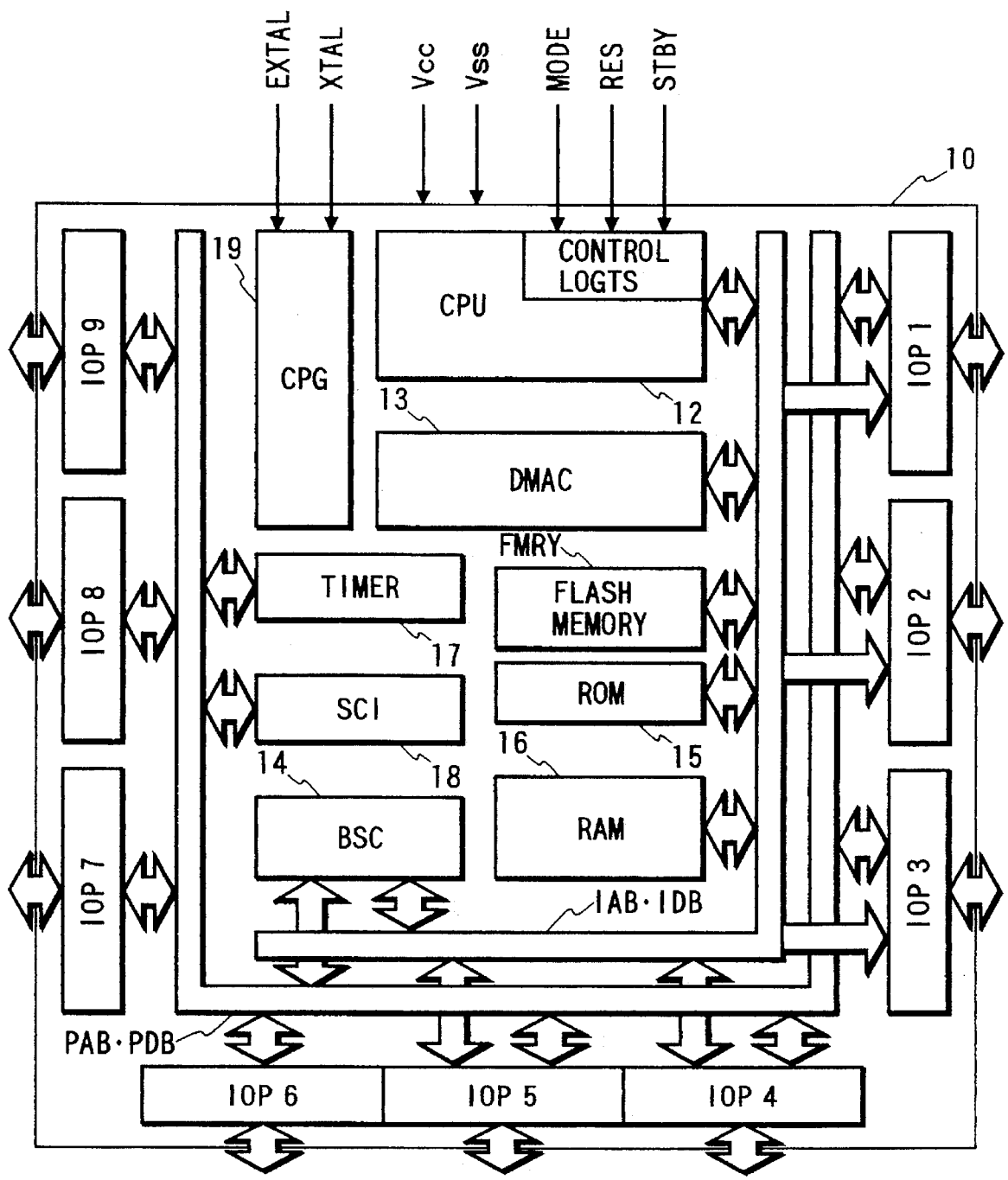
FIG. 7 is a block diagram of a single-chip microcomputer which is a data processor of the embodiment according to the present invention.

FIG. 7 illustrates a single-chip microcomputer containing the above-mentioned flash memory FMRY of an embodiment of the present invention. The single-chip microcomputer 10 shown in FIG. 7 is constituted by functional blocks or modules such as a flash memory FMRY, a CPU 12, a DMAC 13, a bus controller (BSC) 14, a ROM 15, a RAM 16, a timer 17, a serial communication interface (SCI) 18, first to ninth input/output ports IOP1 to IOP9, and a clock generator (CPG) 19, which are formed as a semiconductor integrated circuit on a semiconductor substrate by a widely-known semiconductor manufacturing technology.

The single-chip microcomputer 10 has a ground level terminal Vss and a power source voltage level terminal Vcc as power source terminals, a program/erase high-voltage terminal Vpp of the flash memory FMRY, and, as other special control terminals, a reset terminal RES, a stand-by terminal STBY, a mode control terminal MODE, and clock input terminals EXTAL, XTAL, which are external terminals. When a program/erase high-voltage for the flash memory FMRY is obtained by boosting, inside the circuit, a voltage such as 5 V fed through the power source voltage level terminal Vcc, the external terminal for the high voltage can be omitted. The single-chip microcomputer 10 operates in synchronism with the system clock generated by the clock generator 9 based upon a quartz oscillator that is not shown but is connected to the clock input terminals EXTAL, XTAL. Althernatively, an external clock may be input to the terminal EXTAL. One period of the system clock is called one state. The system clock is a non-overlapped two-phase clock.

The above-mentioned functional blocks are connected to one another through an internal bus. The internal bus is constituted by an address bus, a data bus, and a control bus through which a read signal, a program signal, a bus-size signal, a system clock and the like signals are transmitted. The internal address bus includes IAB, PAB, and the internal data bus includes IDB, PDB. The IAB and IDB are connected to the flash memory FMRY, the CPU 12, the ROM 15, RAM 16, the bus controller 14, and to part of the input/output ports IOP1 to IOP9. The PAB and PDB are connected to the bus controller 14, the timer 17, the SCI 18, and the input/output ports IOP1 to IOP9. The IAB and PAB, and the IDB and PDB are interfaced through the bus controller 14, respectively. Though not limited to this, the PAB and PDB are exclusively used for making access to registers in the functional blocks to which they are connected.

The input/output ports IOP1 to IOP9 are used for inputting and outputting both external bus signals and input/output signals of the input/output circuit. The functions of these ports IOP1 to IOP9 are selected and used by setting their mode or the software. The external address and the external data are connected to the IAB and IDB via buffer circuits that are included in the input/output ports but are not shown. The PAB and PDB are used for reading/writing the built-in registers such as input/output ports and bus controller 14, but have no direct relationship to the external bus.

Both the internal bus and the external bus have a width of 16 bits to effect read/write in a byte size (8 bits) and in a word size (16 bits). The external bus may have a width of 8 bits.

When a system reset signal is applied to the reset terminal RES, the operation mode given by the mode control terminal MODE is taken in, and the single-chip microcomputer (hereinafter often simply referred to as microcomputer) 10 is reset. Though there is no particular limitation, the operation mode determines whether the built-in ROM 15 is valid or invalid, address space is 16 megabyte or 1 megabyte, the initial value of data bus width is 8 bits or 16 bits. As required, plural mode control terminals MODE are provided, and the operation mode is determined by a combination of states of the inputs to these terminals.

When the reset state is canceled, the CPU 12 reads the start address and effects the reset exception processing to start the read of instructions from the start address. Though there is no particular limitation, the start address is stored in a region whose first address is address 0. Thereafter, the CPU 12 executes the instructions successively from the start address.

The DMAC 13 transfers the data under the control of the CPU 12. The CPU 12 and the DMAC 13 effect the read/write operation exclusively to each other by using internal bus and external bus. The arbitration of whether the CPU 12 or the DMAC 13 is operated is performed by the bus controller 14.

The bus controller 14 constitutes a bus cycle in response to the operation of the CPU 12 or the DMAC 13. That is, the bus cycle is formed according to an address, a read signal, a write signal and a bus-size signal output from the CPU 12 or the DMAC 13. For instance, when an address corresponding to the RAM 16 is output to the internal address bus IAB from the CPU 12, the bus cycle of one state is created, and the read/write operation is carried out in one state irrespective of the byte size of word size. When addresses corresponding to the timer 17, the SCI 18 and the input/output ports IOP1 to IOP9 are output to the internal address bus IAB from the CPU 12, the bus cycle of three states is created, whereby the contents of the internal address bus IAB are output to the internal address bus PAB, and the read/write operation is carried out in three states irrespective of the byte size or word size. This control is carried out by the bus controller 14.

In the microcomputer 10 of this embodiment, the flash memory FMRY suitably stores user programs, tuning data, data tables, etc. Though there is no particular limitation, the ROM 15 stores a system program such as an OS.

The operation and control of the flash memory FMRY by the CPU 12 will now be described. The flash memory FMRY is coupled to internal buses IAB and IDB, and is accessible by the CPU 12 and the like. That is, the CPU 12 sets data on controlling the program/erase control register WEREG, and controls the feed of a control signal READ for instructing the operation of reading out the data from the memory cells MC, the feed of an address signal, the feed of write data and the feed of a relief mode signal MD1. The CPU 12 then controls the processing of a so-called software resetting such that the input of a system reset signal from an external reset circuit to the reset terminal RES is controlled and a reset signal MD2 is generated. This will be described later in detail. The reading operation for erase verification and write verification is instructed by the CPU 12, and the data that is read is verified by the CPU 12.

The relief data latch mode for the flash memory FMRY is set by a reset signal MD2 of when the interior of the microcomputer is initialized by the application of a system reset signal of a predetermined level to the reset terminal RES of the microcomputer. The instruction of reset to the reset terminal RES is given from a reset circuit arranged on the system. The reset circuit that is not shown instructs the reset terminal RES to do resetting in response to a power-on reset, the depression of a reset button arranged on the system that is not shown or an instruction from the microcomputer 10. Therefore, the relief data stored in the memory cell in a nonvolatile manner is loaded in the relief data latch CLAT and is utilized upon the start of the power source circuit and upon every initialization of the system.

The resetting based upon the instruction from the microcomputer 10 is utilized when the relief data latch mode is to be set to the flash memory FMRY after the relief data is written by setting the relief data program mode during a data processing such as rewrite of the flash memory FMRY. That is, when a defect in the memory cell MC is detected by verifying of rewrite, the relief data is written into the memory cells MC-C$_0$ to MC-C$_7$ and the defect is relieved by utilizing the relief data. The instruction that the reset circuit outputs a system reset signal may be given to the reset circuit through a predetermined input/output port at a predetermined timing. When a defect in the memory cell MC is detected by verification of erasure or by verification of write while the CPU 12 is rewriting the data into the flash memory FMRY, the relief data itself is written by feeding a relief mode signal MD1 to the flash memory FMRY from the CPU 12 and by establishing the relief program mode. The defective memory cell is the one the data of which could not be erased or into which the data could not be written by the CPU 12 within a predetermined period of time.

Though there is no particular limitation, when a mode signal MODE consisting of a plurality of bits represents a predetermined value, the microcomputer of this embodiment sets an operation mode in which the flash memory FMRY is directly accessible from an external unit. In this operation mode, the CPU 12 substantially stops the control operation for the external unit or is disconnected from the internal buses IDB, IAB, and the flash memory FMRY is directly accessible from an external unit via, for example, input/output ports IOP1 and IOP2. In this operation mode, the microcomputer is apparently equivalent to a single chip of the flash memory FMRY. Therefore, all of the access control data for the flash memory FMRY are fed from an external data processor and the like that are not shown.

In this embodiment, therefore, the operation of writing program or data initially into the flash memory FMRY contained in the microcomputer can be efficiently carried out by using a writing devise such as an EPROM writer or can be carried out under control of the CPU 12 that is contained therein. In the latter case, the rewriting can be effected even in a state that the microcomputer is mounted on the circuit board (on-board state). This can be adapted, for example, to the case where the tuning data are rewritten in, for example, the on-board state. In particular, defects in the memory cell MC can be dealt with by writing the relief data bits into the memory cells MC-C$_0$ to MC-C$_7$ in either of the on-board state and the chip state. Accordingly, even though there is no defect at the initial stage, defect may occur as the characteristics of the memory cells MC are deteriorated with the passage of time. In such a case, the defects can be relieved by programming the relief data for the defects in the on-board state. Even when the data stored in the flash memory FMRY are program data, the defects can be relieved by substituting a memory cell MC-R for redundancy for the defective memory cell MC from the standpoint of circuit structure. The operation for substituting the redundancy memory cell for the defective memory cell is carried out by the address comparator circuit ACMP in compliance with the relief data. Therefore, no load is exerted on the CPU by the processing of substitution.

[5] Relieving defect in the on-board state

Figure 8:
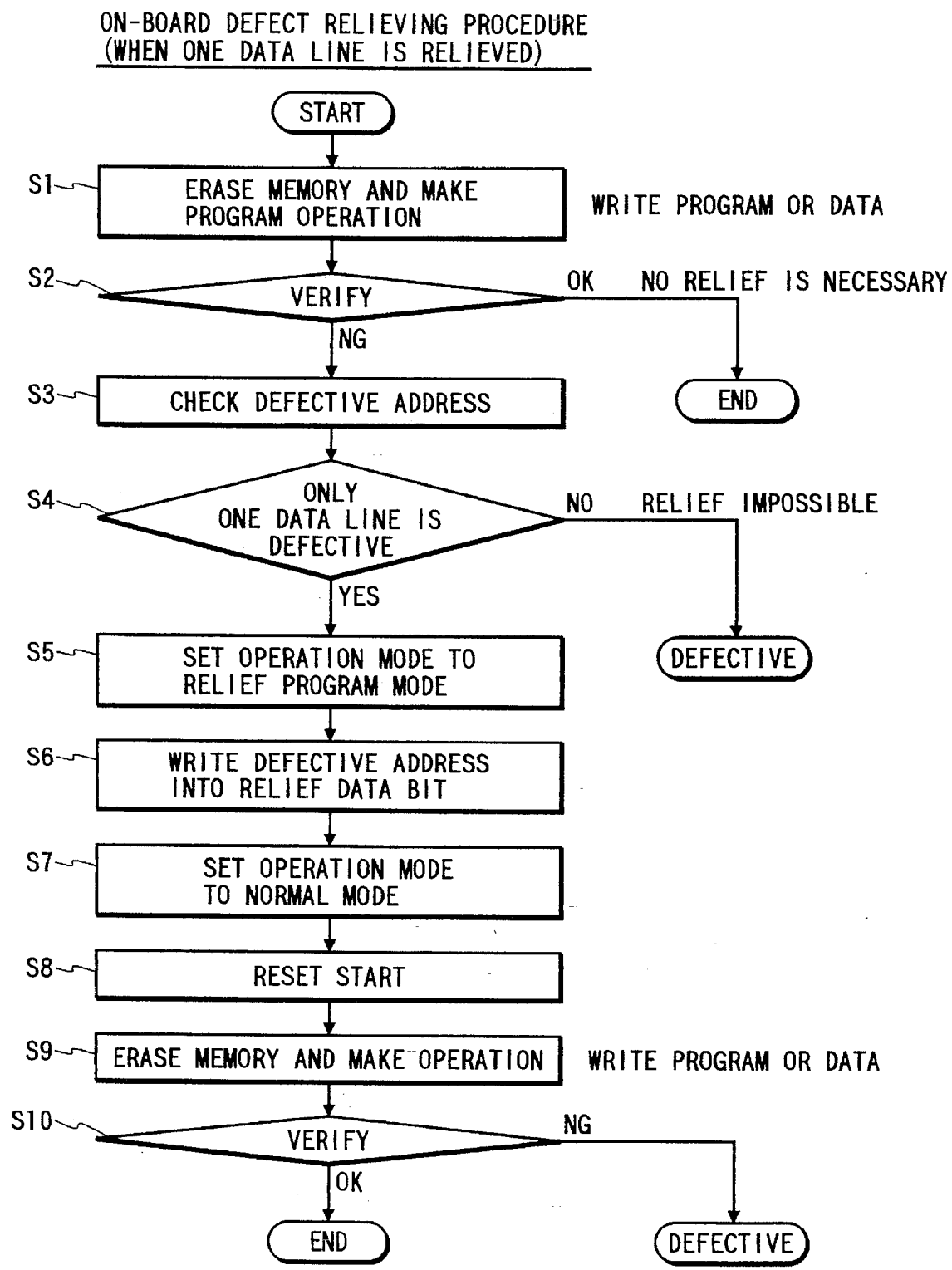
FIG. 8 is a flow chart illustrating the procedure for relieving defects in the flash memory in an on-board state.

FIG. 8 illustrates the procedure for relieving defects in the on-board state. The procedure of FIG. 8 corresponds to the constitution of the flash memory FMRY of FIG. 1. To simplify the description, assume that only one redundant data line DL-R exists and the subject of control is the CPU 12 contained in the microcomputer.

First, the CPU 12 erases the memory cells MC and writes data (step S1), verifies the erasing and writing to check if they are not abnormal (step S2), and judges that no relief is necessary when they are not abnormal. When they are abnormal, the CPU 12 checks defective address (step S3), checks if only one data line is defective or not (step S4), and judges that relief is impossible when a plurality of data lines are defective. When only one data line is defective, the CPU 12 outputs a relief mode signal MD1 to set the relief program mode in the flash memory FMRY (step S5). After this operation mode is set, the CPU 12 sets the bit Vpp and bit P to the program/erase control register WEREG of the flash memory FMRY to set the program mode, feeds relief data, as program data, to the flash memory FMRY, the relief data including defective addresses A2 to A0 designating a data line to which the defective memory cell MC is coupled and a relief enable bit RE* of the low level, and then writes the relief data into the memory cell MC-C (step S6). Thereafter, the CPU 12 is returned to normal mode (step S7) and instructs an external reset circuit to output a system reset signal via a predetermined input/output port. In this case, the data or program that is to be written is stored temporarily in a secondary memory device or the like that is not shown so that it is not lost even when the microcomputer 10 is reset. The microcomputer 10 is then reset, the reset signal MD2 in the microcomputer is at the active level, and a relief data latch mode is set to the flash memory FMRY (step S8). Upon starting reset at step S8, the relief data written into the memory cell MC-C at step S6 is loaded in the relief data latch CLAT, and the defect is ready to be relieved by the relief data. Thereafter, an interrupt is effected from an external unit to effect the erasing and writing again to check if there is no defect in the memory cells of the redundant data line DL-R (step 9). At this moment, the memory cell of the defective data line is replaced by the memory cell MC-R of the redundant data line DL-R, and data is written therein. The writing is then verified (step 10) and the processing is finished when there is no abnormality. When there exists any abnormality, it means that the redundancy memory cell MC-R is defective, and the flash memory FMRY is judged to be defective.

The above-mentioned control procedure can be similarly effected even for a single-chip flash memory FMRY by an external CPU or a data processor.

Figure 9:
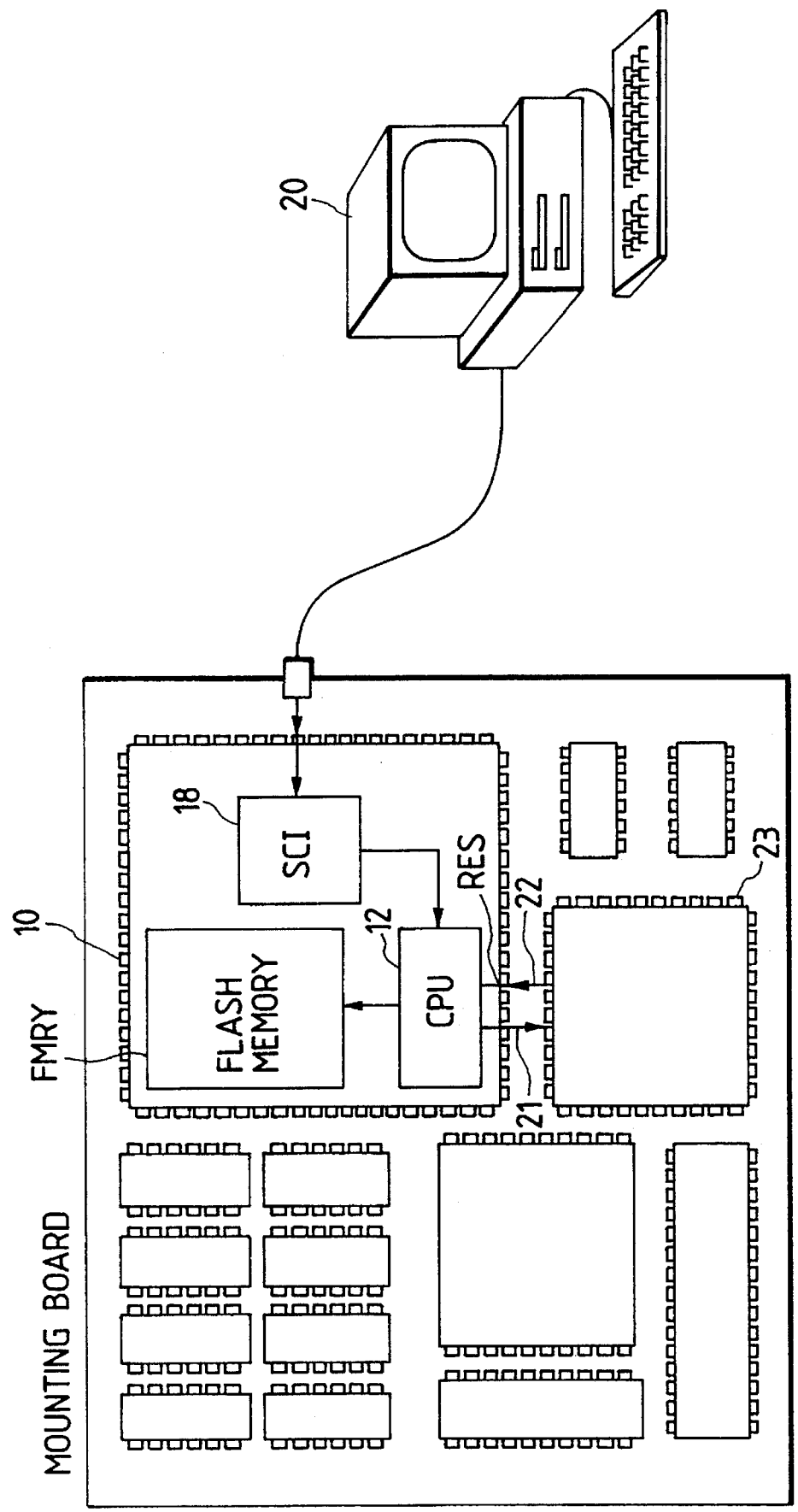
FIG. 9 is a block diagram of a system for reprograming the flash memory in an on-board state.

FIG. 9 illustrates a system constitution of when data or program that is to be written in compliance with the above-mentioned processing procedure is received from an external host unit. Though there is no particular limitation, the host unit (a personal computer, a work station, etc.) 20 is interfaced to the SCI 18 of the microcomputer 10 on the mounting board, and the write data or program is given to the flash memory FMRY via the CPU 12. In FIG. 9, reference numeral 23 denotes a TTL circuit including a reset circuit, 22 denotes a system reset signal for the reset start effected at step S8 of FIG. 8, and reference numeral 21 denotes an instruction signal which instructs the reset circuit to output the system reset signal 22. In the case of FIG. 9, the data or program to be written does not need to evacuate just before the reset start at step S8. An instruction to start step S9 may be given to the CPU 12 from the host unit 20. The above-mentioned rewriting can be effected by the user of the microcomputer 10. The writing by the user is not limited to the one of when the microcomputer is mounted on the mounting board but may be the one of when the microcomputer 10 is mounted on a writer such as a general-purpose PROM writer via a socket adapter.

The above-mentioned embodiment makes it possible to obtain the following functions and effects.

(1) By providing a memory cell MC-C for storing relief data in the memory cell array, a high-voltage generating circuit for programming can be used for writing relief data, so that physical circuit scale of the flash memory FMRY is increased to a minimum extent.

(2) The memory cell MC-C for writing relief data can be easily selected by using a particular signal such as a relief mode signal MD1.

(3) The relief data including the relief enable data RE* is stored in the memory cell MC-C, and there is no need of using a relief program by melt-cutting fuses.

(4) The relief data given to the address comparator circuit ACMP is fed from the relief data latch CLAT. Therefore, there is no need to make access for reading the memory cell MC-R storing relief data for each access, and the relief can be accomplished by redundancy without causing the access speed to decrease.

(5) The address comparator circuit ACMP detects the access to the memory cell MC that is to be relieved and selects the redundancy memory cell MC-R that is to be substituted. Therefore, redundancy can be substituted for defect without exerting any burden on the external unit.

(6) Even when data is stored or program is stored as described above, the defects in the memory cell array can be relieved in the same way. Moreover, even defects caused by deteriorated characteristics of memory cells MC after the passage of time can be easily relieved or, in other words, can be relieved in the on-board state.

(7) When a small number of nonvolatile memory elements of which the data terminals are coupled to a particular data line have defects in the normally-on state, the memory elements that have the data line in common are affected by the defects. The redundant data line DL-R easily relieves the defects in such a state.

(8) The microcomputer 10 equipped with the CPU 12 capable of making access to the flash memory FMRY, easily relieves the defects in the memory cell array in the flash memory FMRY in the on-board state.

(9) By giving the instruction to read the relief data by means of a reset signal MD2 in the microcomputer 10, the relief data can be easily loaded into the relief data latch CLAT irrespective of when the power source circuit is turned on or immediately after the relief data is written.

(10) The procedure for controlling the defect relief can be simplified by storing relief data in the memory cells MC-C and initially loading the relief data into the relief data latch CLAT as part of the rewriting operation in the flash memory FMRY by the CPU 12.

(11) The CPU 12 conducts the self-testing such as erase verification and write verification regularly or at the time of rewriting the data, and self-repairs the defects using the redundancy memory cell MC-R depending upon the result of testing. In the flash memory of the above-mentioned embodiment, the memory cell array as a whole is erased in a batch processing way. Therefore, the write data or the program data that is used for repairing can be received from the external unit and can be used for the rewriting.

In the foregoing was concretely described the invention accomplished by the present inventors by way of an embodiment. It should, however, be noted that the invention is in no way limited thereto only but can be modified in a variety of other ways without departing from the gist and scope of the invention.

For instance, the instruction to load the relief data from the memory cell MC-C for storing the relief data into the latch means CLAT is not limited to the use of the reset signal MD2 but a control signal for use exclusively therefor may be used. When the nonvolatile semiconductor memory device is contained in the data processor, the built-in CPU may output a control signal as part of the rewriting operation. Alternately, the CPU may read out the relief data via the first selection means during a period during which no access is made to the flash memory. In either case, the timing for reading the relief data can be arbitrarily determined within a range that does not hinder the data processing. At least, a timing that does not conflict with the access operation of the CPU for the flash memory may be generated in a software manner or in a hardware manner.

Moreover, the nonvolatile semiconductor memory device may not be limited to the flash memory of the type of simultaneously erasing the whole but may be a flash memory whose contents can be erased in units of a block. For instance, the source line may be shared by the memory cells in each block which is a unit of erasing, and the address of the block to be erased may be designated by an external unit. Moreover, the nonvolatile semiconductor memory device may be an EEPROM using transistors of an NMOS type or may be an EPROM of an ultraviolet-ray erasing type. The microcomputer may be realized without a ROM 15 but using a nonvolatile semiconductor memory device such as flash memory only. Moreover, either data or program may be stored in a nonvolatile semiconductor memory such as a flash memory.

The effects obtained by a representative example of the invention disclosed in this application will be briefly described below.

That is, defects in the memory array of a nonvolatile semiconductor memory device can be relieved in the on-board state without causing a great increase in the area or an increase in the access time, whether the information is the program or the data. In other words, it is allowed to relieve defects in the memory cell array caused by deteriorated characteristics of memory elements after they have been assembled in the device, without using any special steps or devices.

When a nonvolatile semiconductor memory device is contained together with the central processing unit in the form of on-chip, the central processing unit executes self-testing and repairs the defects using a redundancy memory element according to the result of testing.

What is claimed is:

1. A semiconductor memory device comprising:
   a plurality of memory cells for storing data as threshold voltage values;
   a plurality of redundancy memory cells for storing data as threshold voltage values to relieve a defective memory cell in said plurality of memory cells;
   a plurality of relieving memory cells for storing the address of a defective memory cell as a threshold voltage value;
   a first selection unit for selecting at least one memory cell or at least one redundancy memory cell of said plurality of memory cells and said redundancy memory cells according to an address that is fed; and
   a second selection unit for selecting said plurality of relieving memory cells according to a signal that is fed.

2. A semiconductor memory device according to claim 1, wherein each of said plurality of memory cells and said plurality of redundancy memory cells has a first semiconductor region and a second semiconductor region formed in a semiconductor substrate, a first insulating film covering at least a channel-forming region between said first semiconductor region and said second semiconductor region, a floating gate formed on said first insulating film and extending over said first semiconductor region and said second semiconductor region, a second insulating film formed on said floating gate, and a control gate formed on said second insulating film and coupled to one of a plurality of word lines.

3. A semiconductor memory device according to claim 2, wherein said first semiconductor region of each of said plurality of memory cells is coupled to a corresponding data line of said plurality of data lines, and said first semiconductor region of each of said plurality of redundancy memory cells is coupled to at least a redundancy data line.

4. A semiconductor memory device according to claim 3, wherein each of said relieving memory cells has a first semiconductor region coupled to at least one of said redundancy data lines and a second semiconductor region formed in a semiconductor substrate, a first insulating film covering at least a channel-forming region between said first semiconductor region and said second semiconductor region, a floating gate formed on said first insulating film and extending over said first semiconductor region and said second semiconductor region, a second insulating film formed on said floating gate, and a control gate formed on said second insulating film and coupled to a word line for selecting relieving memory cells.

5. A semiconductor memory device according to claim 4, wherein said first selection unit includes a decoder unit for selecting a word line of said plurality of word lines and at least one data line of said plurality of data lines according to the address that is fed, and a redundancy decoder unit for selecting at least one of said redundancy data lines.

6. A semiconductor memory device according to claim 5, wherein when a relief mode signal is fed to said second selection unit, said first selection unit is inhibited from selecting a word line of said plurality of word lines and selecting at least one data line of said plurality of data lines, and the address of a defective memory cell is written into said relieving memory cells.

7. A semiconductor memory device according to claim 6, wherein when a reset signal is fed to said second selection unit, the address of a redundancy memory cell stored in said relieving memory cell is written into said relief data latch.

8. A semiconductor memory device according to claim 7, wherein said redundancy selection unit includes a comparator unit which compares the address that is fed with the address stored in said relief data latch.

9. A semiconductor memory device according to claim 1, wherein each of said plurality of memory cells has a first semiconductor region and a second semiconductor region formed in a semiconductor substrate, a first insulating film covering at least a channel-forming region between said first semiconductor region and said second semiconductor region, a floating gate formed over said first insulating film and extending over said first semiconductor region and said second semiconductor region, a second insulating film formed on said floating gate, and a control gate formed on said second insulating film and coupled to one of a plurality of word lines, and each of said plurality of redundancy memory cells has a first semiconductor region and a second semiconductor region formed in a semiconductor substrate, a first insulating film covering at least a channel-forming region between said first semiconductor region and said second semiconductor region, a floating gate formed on said first insulating film and extending over said first semiconductor region and said second semiconductor region, a second insulating film formed on said floating gate, and a control gate formed on said second insulating film and coupled to at least one of redundancy word lines.

10. A semiconductor memory device according to claim 9, wherein said first semiconductor region of each of said plurality of memory cells and said first semiconductor region of each of said plurality of redundancy memory cells are connected to a corresponding data line of a plurality of data lines.

11. A semiconductor memory device according to claim 10, wherein each of said relieving memory cells has a first semiconductor region and a second semiconductor region formed in a semiconductor substrate and coupled to a data line of said plurality of data lines, a first insulating film covering at least a channel-forming region between said first semiconductor region and said second semiconductor region, a floating gate formed on said first insulating film and extending over said first semiconductor region and said second semiconductor region, a second insulating film formed on said floating gate, and a control gate formed on said second insulating film and coupled to a word line for selecting relieving memory cells.

12. A semiconductor memory device according to claim 11, wherein said first selection unit includes a decoder unit for selecting a word line of said plurality of word lines and at least one data line of said plurality of data lines according to the address that is fed, and a redundancy decoder unit for selecting at least one of said redundancy word lines.

13. A semiconductor memory device according to claim 12, wherein when a relief mode signal is fed to said second selection unit, said first selection unit is inhibited from selecting a word line of said plurality of word lines and selecting at least one data line of said plurality of data lines, and the address of a defective memory cell is written into said relieving memory cells.

14. A semiconductor memory device according to claim 13, wherein when a reset signal is fed to said second selection unit, the address of a redundancy memory cell stored in said relieving memory cell is written into said relief data latch.

15. A semiconductor memory device according to claim 14, wherein said redundancy selection unit includes a comparator unit which compares the address that is fed with the address stored in said relief data latch.

16. A microcomputer comprising:

a central processing unit and a semiconductor memory device including:

a plurality of memory cells for storing data as threshold voltage values;

a plurality of redundancy memory cells for storing data as threshold voltage values to relieve a defective memory cell in said plurality of memory cells;

a plurality of relieving memory cells for storing the address of a defective memory cell as a threshold voltage value;

a first selection unit for selecting at least one memory cell or at least one redundancy memory cell from said plurality of memory cells and said redundancy memory cells according to the address that is fed from said central processing unit; and a second selection unit for selecting said plurality of relieving memory cells according to the signal that is fed from said central processing unit.

17. A microcomputer according to claim 16, wherein each of said plurality of memory cells and said plurality of redundancy memory cells has a first semiconductor region and a second semiconductor region formed in a semiconductor substrate, a first insulating film covering at least a channel-forming region between said first semiconductor region and said second semiconductor region, a floating gate formed on said first insulating film and extending over said first semiconductor region and said second semiconductor region, a second insulating film formed on said floating gate, and a control gate formed on said second insulating film and coupled to one of a plurality of word lines.

18. A microcomputer according to claim 17, wherein said first semiconductor region of each of said plurality of memory cells is coupled to a corresponding data line of said plurality of data lines, and said first semiconductor region of each of said plurality of redundancy memory cells is coupled to at least a redundancy data line.

19. A microcomputer according to claim 18, wherein each of said relieving memory cells has a first semiconductor region coupled to at least one of said redundancy data lines and a second semiconductor region formed in a semiconductor substrate, a first insulating film covering at least a channel-forming region between said first semiconductor region and said second semiconductor region, a floating gate formed on said first insulating film and extending over said first semiconductor region and said second semiconductor region, a second insulating film formed on said floating gate, and a control gate formed on said second insulating film and coupled to a word line for selecting relieving memory cells.

20. A microcomputer according to claim 19, wherein said first selection unit includes a decoder unit for selecting a word line of said plurality of word lines and at least one data line of said plurality of data lines according to the address that is fed from said microcomputer, and a redundancy decoder unit for selecting at least one of said redundancy data lines.

21. A microcomputer according to claim 20, wherein said central processing unit verifies the data in said plurality of memory cells after said semiconductor memory device has executed the programming operation or the erasing operation, and outputs a relief mode signal when a defective memory cell in which the data has not been written or of which the data has not been erased is found.

22. A microcomputer according to claim 21, wherein when a relief mode signal is fed to said second selection unit from said control processing unit, said first selection unit is inhibited from selecting a word line of said plurality of word lines and selecting at least one data line of said plurality of data lines, and the address of a defective memory cell fed from said control processing unit is written into said relieving memory cells.

23. A microcomputer according to claim 22, wherein when a reset signal is fed to said second selection unit from said central processing unit, the address of a defective memory cell stored in said relieving memory cell is written into said relief data latch.

24. A microcomputer according to claim 23, wherein said redundancy selection unit includes a comparator unit which compares the address that is fed from said central processing unit with the address stored in said relief data latch.

25. A microcomputer according to claim 16, wherein each of said plurality of memory cells has a first semiconductor region and a second semiconductor region formed in a semiconductor substrate, a first insulating film covering at least a channel-forming region between said first semiconductor region and said second semiconductor region, a floating gate formed on said first insulating film and extending over said first semiconductor region and said second semiconductor region, a second insulating film formed on said floating gate, and a control gate formed on said second insulating film and coupled to one of a plurality of word lines, and each of said plurality of redundancy memory cells has a first semiconductor region and a second semiconductor region formed in a semiconductor substrate, a first insulating film covering at least a channel-forming region between said first semiconductor region and said second semiconductor region, a floating gate formed on said first insulating film and extending over said first semiconductor region and said second semiconductor region, a second insulating film formed on said floating gate, and a control gate formed on said second insulating film and coupled to at least one of redundancy word lines.

26. A microcomputer according to claim 25, wherein said first semiconductor region of each of said plurality of memory cells and said first semiconductor region of each of said plurality of redundancy memory cells are connected to a corresponding data line of a plurality of data lines.

27. A microcomputer according to claim 26, wherein each of said relieving memory cells has a first semiconductor region and a second semiconductor region formed in a semiconductor substrate and coupled to a data line in said plurality of data lines, a first insulating film covering at least a channel-forming region between said first semiconductor region and said second semiconductor region, a floating gate formed on said first insulating film and extending over said first semiconductor region and said second semiconductor region, a second insulating film formed on said floating gate, and a control gate formed on said second insulating film and coupled to a word line for selecting relieving memory cells.

28. A microcomputer according to claim 27, wherein said first selection unit includes a decoder unit for selecting a word line of said plurality of word lines and at least one data line of said plurality of data lines according to the address that is fed from said central processing unit, and a redundancy decoder unit for selecting at least one of said redundancy word lines.

29. A microcomputer according to claim 28, wherein said second selection unit includes a comparator unit which compares the address that is fed from said central processing unit with the address stored in said relief data latch.

30. A microcomputer according to claim 29, wherein said central processing unit verifies the data in said plurality of memory cells after said semiconductor memory device has executed the programming operation or the erasing operation, and outputs a relief mode signal when a defective memory cell in which data has not been written or of which the data has not been erased is found.

31. A microcomputer according to claim 30, wherein when a relief mode signal is fed to said second selection unit from said central processing unit, said first selection unit is inhibited from selecting a word line of said plurality of word lines and selecting at least one data line of said plurality of data lines, and an address of a defective memory cell from said central processing unit is written into said relieving memory cell.

32. A microcomputer according to claim 31, wherein when a reset signal is fed to said second selection unit from said central processing unit, the address of a defective memory cell stored in said relieving memory cell is written into said relief data latch.

33. A microcomputer according to claim 32, wherein said redundancy selection unit includes a comparator unit which compares the address that is fed from said central processing unit with the address stored in said relief data latch.

* * * * *